US010290678B2

United States Patent
Gao et al.

(10) Patent No.: US 10,290,678 B2
(45) Date of Patent: May 14, 2019

(54) MAGNETIC SHIELDING PACKAGE STRUCTURE FOR MRAM DEVICE AND METHOD FOR PRODUCING THE SAME

(71) Applicant: GLOBALFOUNDRIES Singapore Pte. Ltd., Singapore (SG)

(72) Inventors: Shan Gao, Malta, NY (US); Boo Yang Jung, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/716,115

(22) Filed: Sep. 26, 2017

(65) Prior Publication Data

US 2019/0096956 A1 Mar. 28, 2019

(51) Int. Cl.
| | | |
|---|---|---|
| *H01L 43/00* | (2006.01) | |
| *H01L 27/22* | (2006.01) | |
| *H01L 43/02* | (2006.01) | |
| *H01L 43/12* | (2006.01) | |
| *H05K 1/11* | (2006.01) | |
| *H05K 1/05* | (2006.01) | |
| *H05K 1/09* | (2006.01) | |
| *H05K 3/40* | (2006.01) | |

(Continued)

(52) U.S. Cl.
CPC ............ *H01L 27/222* (2013.01); *H01L 24/06* (2013.01); *H01L 24/09* (2013.01); *H01L 24/17* (2013.01); *H01L 43/02* (2013.01); *H01L 43/12* (2013.01); *H05K 1/05* (2013.01); *H05K 1/09* (2013.01); *H05K 1/115* (2013.01); *H05K 3/32* (2013.01); *H05K 3/4038* (2013.01); *H01L 2224/0401* (2013.01); *H05K 2201/10159* (2013.01)

(58) Field of Classification Search
CPC ......... H01L 43/08; H01L 43/12; H01L 43/02; H01L 27/222; H01L 24/06; H01L 24/17
USPC ......................................... 257/422
See application file for complete search history.

(56) References Cited

U.S. PATENT DOCUMENTS 6,882,041 B1 * 4/2005 Cheah ................. H01L 21/54
257/667
7,312,525 B2 * 12/2007 Tatt ..................... H01L 23/3677
257/704

(Continued)

OTHER PUBLICATIONS

English Translation of Office Action for corresponding German Patent Application No. 10 2018 200 633.4, dated Jun. 22, 2018, 4 pages.

*Primary Examiner* — Theresa T Doan
(74) *Attorney, Agent, or Firm* — Ditthavong & Steiner, P.C.

(57) ABSTRACT

Methods of magnetically shielding an MRAM structure on all six sides in a thin wire or thin flip chip bonding package and the resulting devices are provided. Embodiments include forming a first metal layer embedded between an upper and a lower portion of a PCB substrate, the first metal layer having a pair of metal filled vias laterally separated; attaching a semiconductor die to the upper portion of the PCB substrate between the pair of metal filled vias; connecting the semiconductor die electrically to the PCB substrate through the pair of metal filled vias; removing a portion of the upper portion of the PCB substrate outside of the pair of metal filled vias down to the first metal layer; and forming a second metal layer over and on four opposing sides of the semiconductor die, the second metal layer landed on the first metal layer.

13 Claims, 8 Drawing Sheets

(51) Int. Cl.
*H01L 23/00* (2006.01)
*H05K 3/32* (2006.01)

(56) References Cited

U.S. PATENT DOCUMENTS

| | | |
|---|---|---|
| 2007/0124930 A1 | 6/2007 | Cheng et al. |
| 2007/0285957 A1 | 12/2007 | Stobbs |
| 2011/0115066 A1 | 5/2011 | Kim et al. |
| 2012/0193737 A1 | 8/2012 | Pang et al. |
| 2012/0211846 A1 | 8/2012 | Li et al. |
| 2014/0197505 A1 | 7/2014 | Zhou et al. |

\* cited by examiner

FIG. 8

MAGNETIC SHIELDING PACKAGE STRUCTURE FOR MRAM DEVICE AND METHOD FOR PRODUCING THE SAME

TECHNICAL FIELD

The present disclosure relates to design and fabrication methods for semiconductor packages. The present disclosure is particularly applicable to magnetic random access memory (MRAM) structures in integrated circuit (IC).

BACKGROUND

IC chips, such as, MRAM chips, are typically encapsulated in protective packages to prevent errors from stray or externally applied electromagnetic fields and to prevent damage during subsequent processing. MRAM structures, both wire bonded and flip-chip, need to be shielded from all six sides with a protective layer for better protection, however, known wire-bonding shielding approaches result in high package thickness and lower efficiency because (i) the shielding material is not formed in a closed loop, which is especially true for perpendicular MRAM structures; (ii) the wire-bonding pad area is often too big; and (iii) process challenges for wire-bonding if the substrate pad opening area in a printed circuit board (PCB) substrate is too small. Flip chip MRAM packages pose additional problems because (i) flip chip MRAM have a wider bottom shield opening compared to wire-bonding, thereby less magnetic shield efficiency; and (ii) individual openings of the bottom shield promote a high risk of electrical shortage between the metal bumps and shield metal and pose a limitation in terms of fine pitch opening on the bottom shield.

Figure 1:
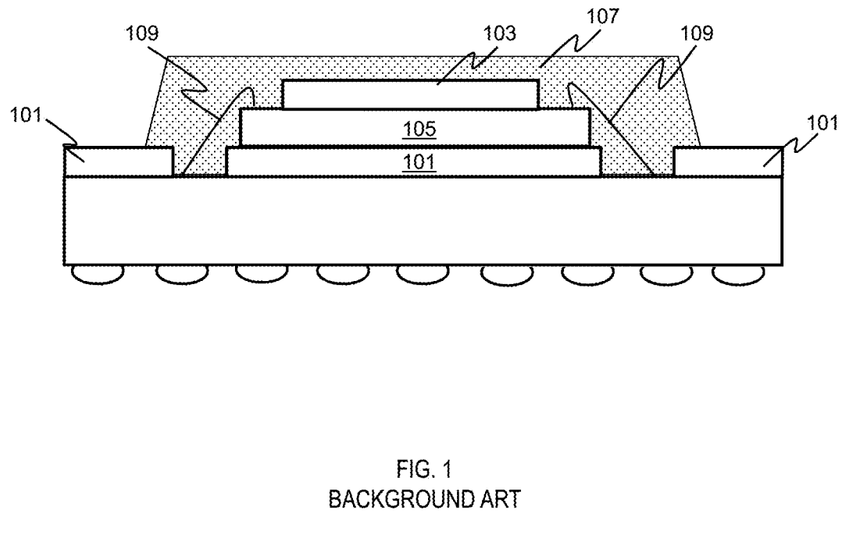
FIGS. 1 and 2 show process challenges for magnetically shielding an MRAM structure in a wire bound MRAM package.
Figure 2:
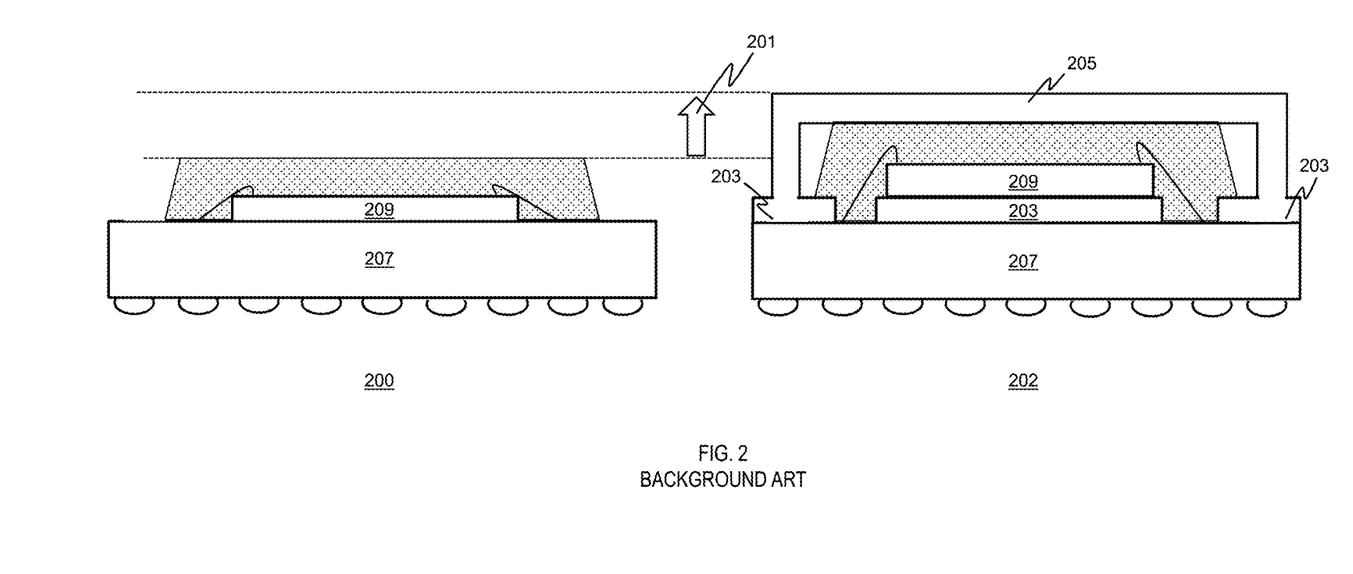

Referring to FIG. 1, a cross-sectional view of a known wire bound MRAM package, protective shield layers 101 and 103 are formed below and over a portion of the MRAM structure 105, respectively, and an epoxy molding compound (EMC) layer 107 is subsequently formed over shield layers 101 and 103, the MRAM structure 105 and the wire 109. As described above, this design is problematic because the protective layers 101 and 103 do not encapsulate the MRAM structure 105 on all six sides. As a result, the MRAM structure 105 is exposed to stray or externally applied electromagnetic fields and to subsequent processing steps. Referring to FIG. 2, a conventional wire bonding package 200 is compared to a known MRAM wire bonding package 202 to show the buildup in MRAM wire-bonding pad area (depicted by the arrow 201) while forming protective layers 203 and 205 over a PCB substrate 207 to protect the MRAM structure 209. Further, the predetermined distance between the MRAM structure 209 and the protective layers 203 and 205 increases the package thickness.

A need therefore exists for methodology enabling magnetically shielding an MRAM structure on all six sides without compromising package thickness.

SUMMARY

An aspect of the present disclosure is a method of magnetically shielding an MRAM structure on all six sides with a thin package profile.

Another aspect of the present disclosure is a device with an MRAM structure magnetically shielded on all six sides with a thin package profile.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first metal layer embedded between an upper and a lower portion of a PCB substrate, the first metal layer having a pair of metal filled vias laterally separated; attaching a semiconductor die to the upper portion of the PCB substrate between the pair of metal filled vias; connecting the semiconductor die electrically to the PCB substrate through the pair of metal filled vias; removing a portion of the upper portion of the PCB substrate outside of the pair of metal filled vias down to the first metal layer; and forming a second metal layer over and on four opposing sides of the semiconductor die, the second metal layer landed on the first metal layer.

Aspects of the present disclosure include forming the first and second metal layers of a nickel (Ni)-iron (Fe) alloy. Another aspect includes forming the first and second metal layers to a thickness of 50 micrometer (µm) to 1000 µm. Additional aspects include forming a pair of vias laterally separated in the first metal layer; forming a dielectric layer in the pair of vias and over top and bottom surfaces of the first metal layer; removing portions of the dielectric layer through the pair of vias; and filling the pair of vias with a metal prior to forming the first metal layer embedded between the upper and lower portions of the PCB substrate, the pair of metal filled vias formed. Further aspects include connecting the semiconductor die electrically to the PCB substrate by bonding the semiconductor die with wire. Additional aspects include connecting the semiconductor die electrically to the PCB substrate by bonding the semiconductor die with under-bump metallurgy (UBM) pads. Further aspects include the semiconductor die electrically connected to the PCB substrate by the UBM pads, the method further including: forming a metal layer between the UBM pads and the upper portion of the PCB substrate prior to connecting the semiconductor die. Another aspect includes forming the second metal layer over the semiconductor die by: forming a 100 µm to 1,000 µm gap between the second metal layer and the semiconductor die. Additional aspects include forming the second metal layer over the semiconductor die by: forming the second metal layer on the semiconductor die. Further aspects include the semiconductor die including an MRAM structure.

Another aspect of the present disclosure is a device including: a first metal layer embedded between an upper and lower portion of a PCB substrate, the first metal layer having a pair of metal filled vias laterally separated; a dielectric layer on sidewalls of each via and over top and bottom surfaces of the first metal layer; a semiconductor die attached to the upper portion of the PCB substrate between the pair of metal filled vias; and a second metal layer over and on four opposing sides of the semiconductor die, the second metal layer landed on the first metal layer through the top portion of the PCB substrate.

Aspects of the device include the first and second metal layers including Ni—Fe alloy. Another aspect includes the first and second metal layers having a thickness of 50 µm to 1000 µm. Other aspects include the second metal layer is 100 µm to 1,000 µm over the semiconductor die. A further aspect includes the second metal layer is on the semiconductor die. Additional aspects include the pair of metal filled vias including Cu. A further aspect includes the semiconductor die including an MRAM structure.

A further aspect of the present disclosure is a method including: forming a first metal layer to a thickness of 50 μm to 1000 μm embedded between an upper and a lower portion of a PCB substrate, the first metal layer having a pair of metal filled vias laterally separated; attaching an MRAM structure to the upper portion of the PCB substrate between the pair of metal filled vias; connecting the MRAM structure electrically to the PCB substrate through the pair of metal filled vias by bonding the MRAM structure with wires or UBM pads; removing a portion of the upper portion of the PCB substrate outside of the pair of metal filled vias down to the first metal layer; and forming a second metal layer to a thickness of 50 μm to 1000 μm over and on four opposing sides of the MRAM structure, the second metal layer landed on the first metal layer.

Aspects of the present disclosure include forming the first and second metal layers of a Ni—Fe alloy. A further aspect includes forming a pair of vias laterally separated in the first metal layer; forming a dielectric layer in the pair of vias and over top and bottom surfaces of the first metal layer; removing portions of the dielectric layer through the pair of vias; and filling the pair of vias with a metal prior to forming the first metal layer, the pair of metal filled vias formed.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of high package thickness and low efficiency attendant upon forming a magnetic shielding package structure over an MRAM device. The problem is solved, inter alia, by forming a metal shield on all six sides of a MRAM structure with the bottom metal shield embedded in a PCB substrate and electrical connection in the substrate by via through the bottom shield metal.

Methodology in accordance with embodiments of the present disclosure includes forming a first metal layer embedded between an upper and a lower portion of a PCB substrate, the first metal layer having a pair of metal filled vias laterally separated. A semiconductor die is attached to the upper portion of the PCB substrate between the pair of metal filled vias, and the semiconductor die is electrically connected to the PCB substrate through the pair of metal filled vias. A portion of the upper portion of the PCB substrate outside of the pair of metal filled vias is removed down to the first metal layer, and a second metal layer is formed over and on four opposing sides of the semiconductor die, the second metal layer landed on the first metal layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 3:
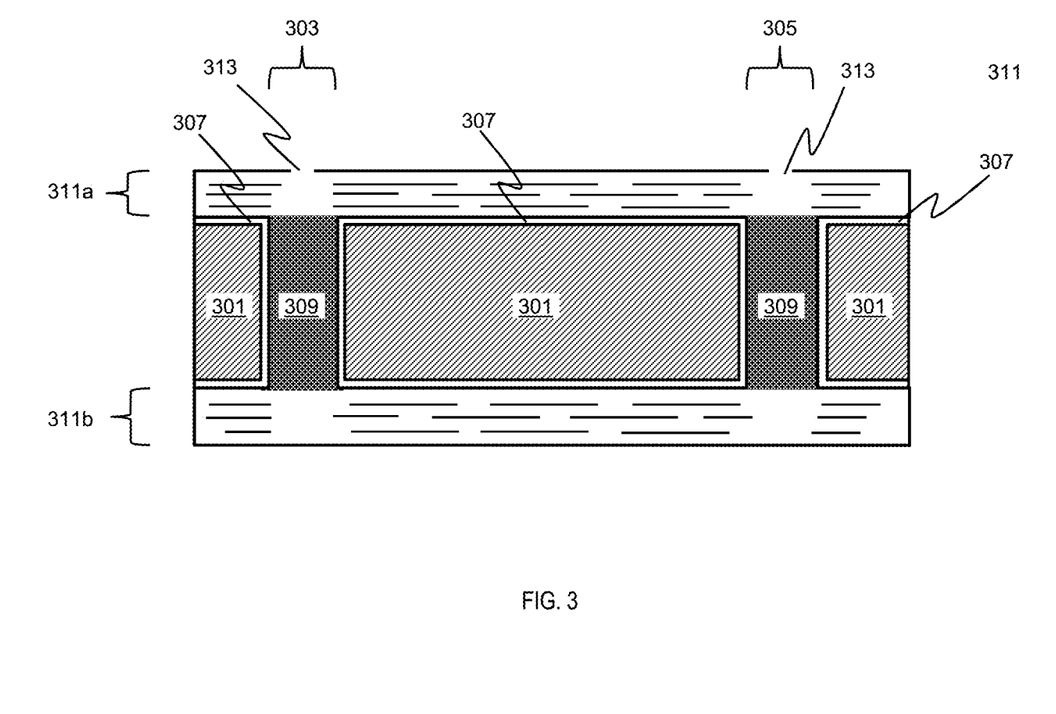
FIGS. 3 through 5 schematically illustrate cross-sectional views of a process flow for magnetically shielding an MRAM structure on all six sides in a thin wire bonding package, in accordance with an exemplary embodiment.
Figure 4:
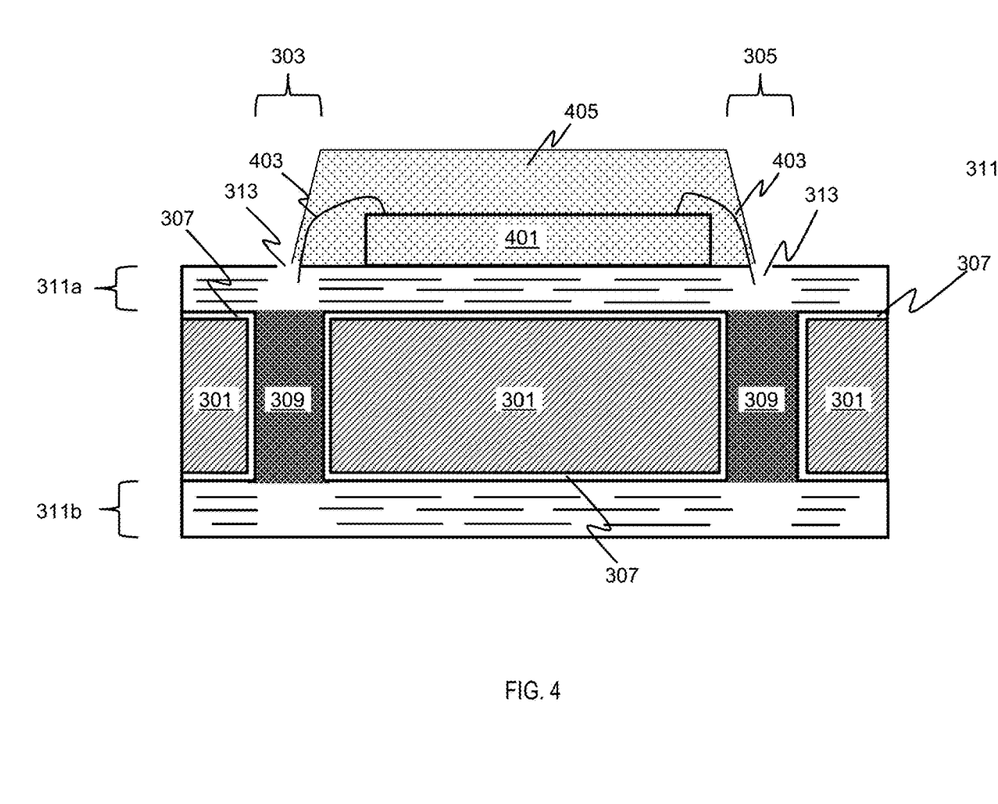
Figure 5:
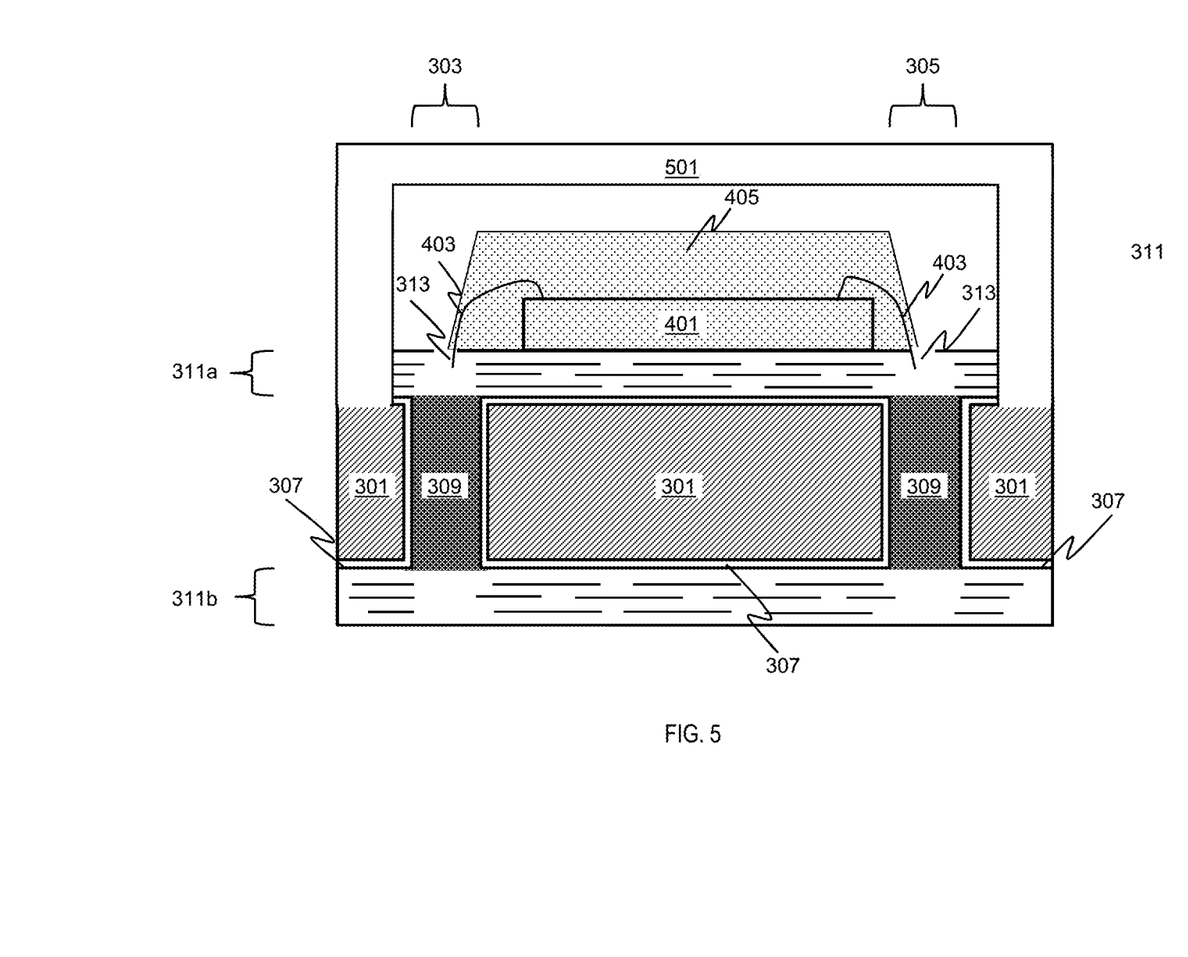

FIGS. 3 through 5 schematically illustrate cross-sectional views of a process flow for magnetically shielding an MRAM structure on all six sides in a thin wire bonding package, in accordance with an exemplary embodiment. Referring to FIG. 3, a metal layer 301 is formed, e.g., of a Ni—Fe alloy, to a thickness, e.g., of 50 μm to 1000 μm. Then, vias 303 and 305 are formed through the metal layer 301. Next, a dielectric layer 307 is formed, e.g., of a polymer, along the sidewalls of the vias 303 and 305 and over and under the metal layer 301 by first forming the dielectric layer 307 in the vias 303 and 305 and over and under the metal layer 301 and then etching the dielectric layer 307 through the vias 303 and 305 (not shown for illustrative convenience). The vias 303 and 305 then are filled with a metal layer 309, e.g., Cu. Next, a PCB substrate 311 having an upper portion 311a and a lower portion 311b are formed over the top and bottom surface of the metal layer 301, respectively, with the metal filled vias 303 and 305 connecting the upper and lower portions of the PCB substrate 311, respectively. Subsequently, the upper portion of the PCB substrate 311a is patterned (represented by openings 313).

Referring to FIG. 4, a semiconductor die 401, e.g., an MRAM structure, is attached to the upper portion 311a of the PCB substrate 311 between the metal filled vias 303 and 305. The semiconductor die 401 is electrically connected to the PCB substrate 311 by bonding the semiconductor die 401 with wire 403 that is connected to the metal filled vias 303 and 305. Subsequently, an EMC layer 405 is formed over the semiconductor die 401 and wire 403. As depicted in FIG. 5, portions of the upper portion 311a of the PCB substrate 311 outside of the pair of metal filled vias 303 and 305 are etched down to the metal layer 301. Next, a metal layer 501 is formed, e.g., of a Ni—Fe alloy to a thickness of 50 μm to 1000 μm, over, e.g., 100 μm to 1,000 μm, and on four opposing sides of the semiconductor die 401 and EMC layer 405, and landed on the metal layer 301.

Figure 6:
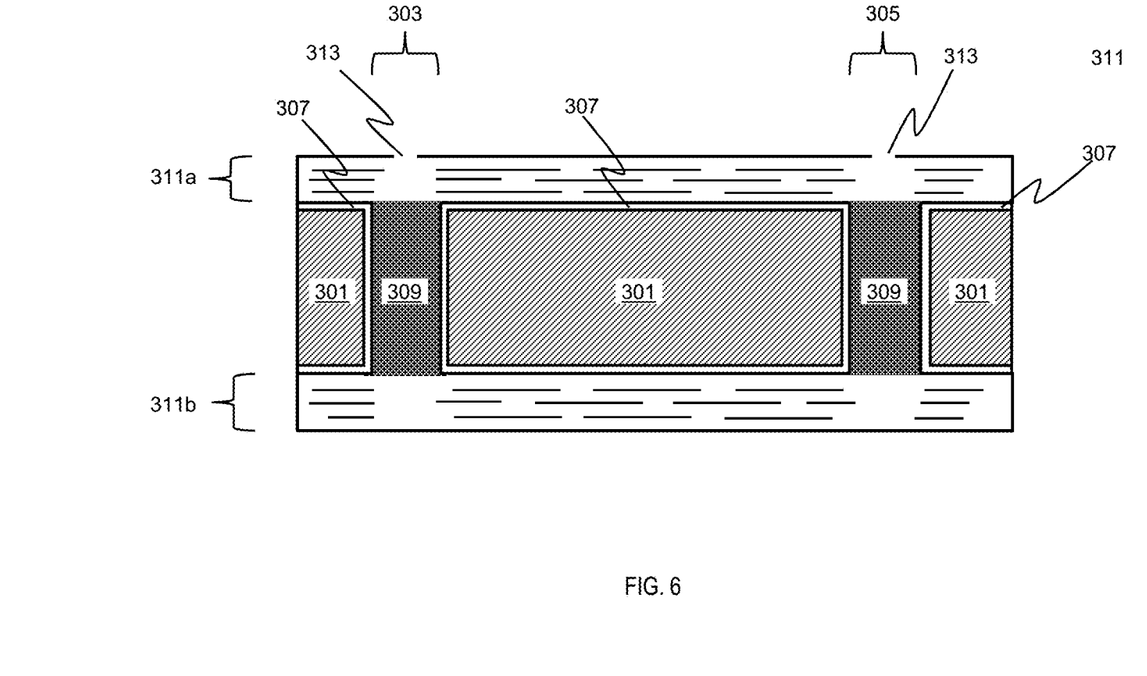
FIGS. 6 through 8 schematically illustrate cross-sectional views of a process flow for magnetically shielding an MRAM structure on all six sides in a thin flip chip package, in accordance with an exemplary embodiment.
Figure 7:
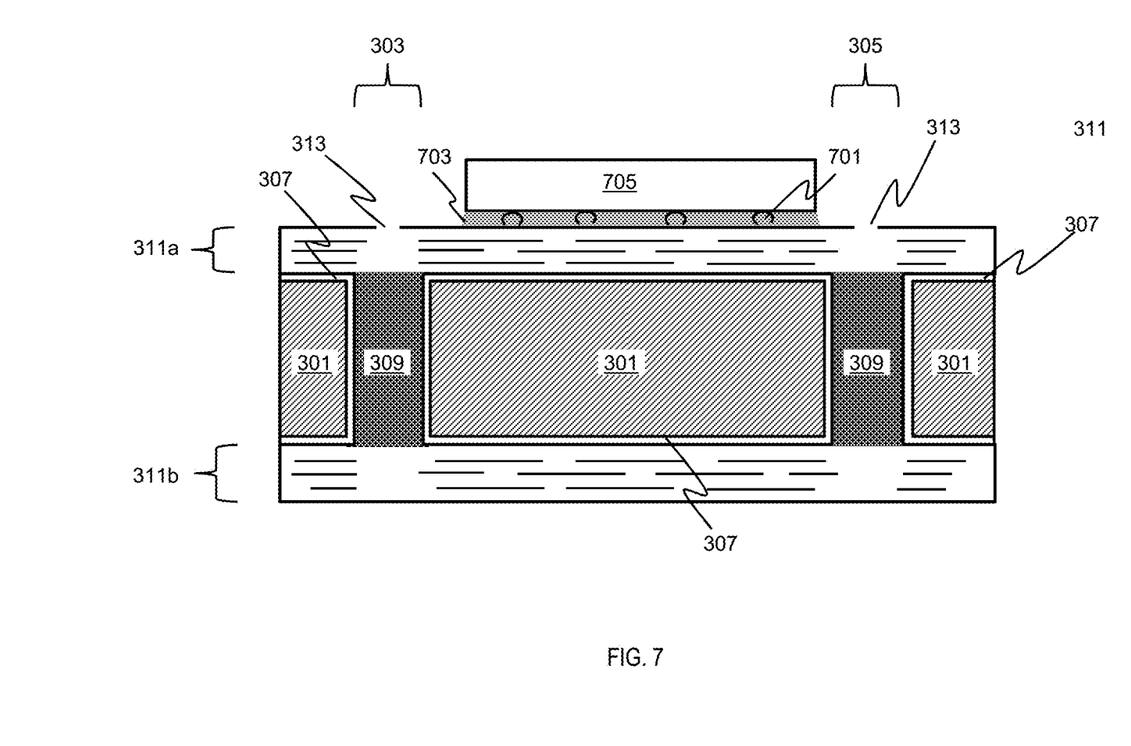
Figure 8:
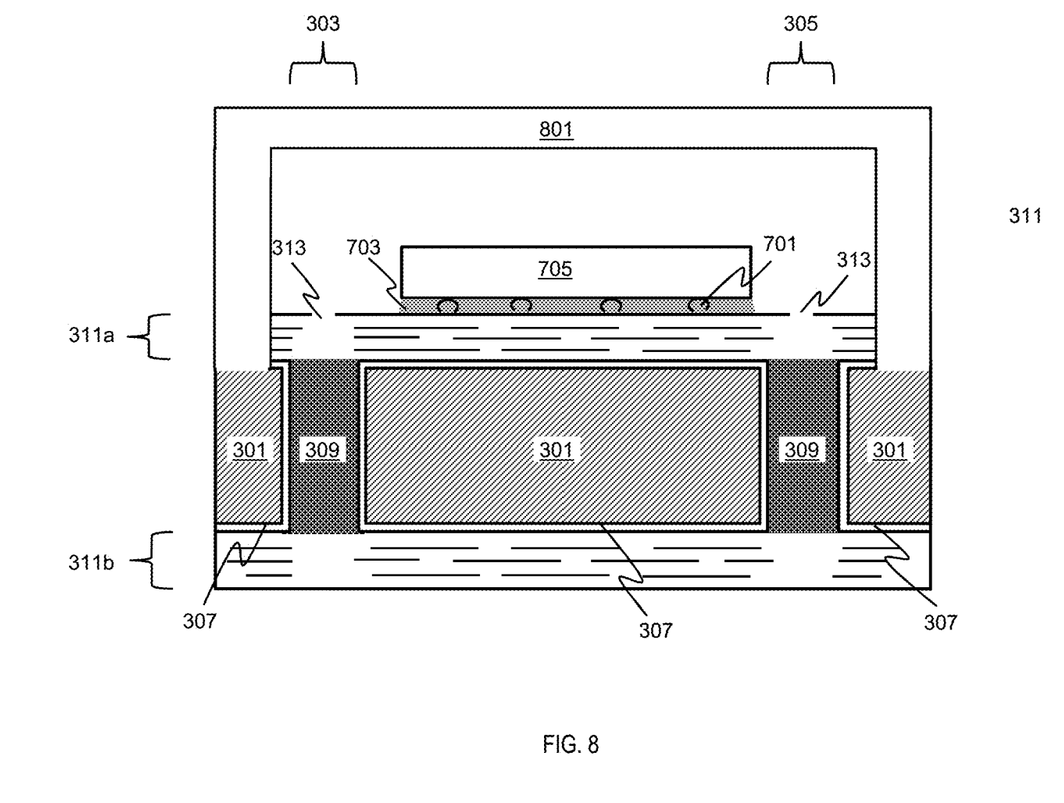

FIGS. 6 through 8 schematically illustrate cross-sectional views of a process flow for magnetically shielding an MRAM structure on all six sides in a thin flip chip package, in accordance with an exemplary embodiment. The initial device of FIG. 6 is the same as the device of FIG. 3 and is formed using the same process steps. Referring to FIG. 7, a metal layer (not shown for illustrative convenience) is formed on portions of the upper portion 311a of the PCB substrate 311. Then, UBM pads 701 are formed on the upper portion 311a of the PCB substrate 311 on the metal layer. Subsequently, an underfill 703 is formed over the UBM pads 701. Next, a semiconductor die 705, e.g., an MRAM structure, is bonded with the UBM pads 701, whereupon the semiconductor die 705 is electrically connected to the PCB substrate 311. As depicted in FIG. 8, a portion of the upper portion 311a of the PCB substrate 311 outside of the pair of metal filled vias 303 and 305 are etched down to the metal layer 301. Then, a metal layer 801 is formed, e.g., of a Ni—Fe alloy, to a thickness of 50 μm to 1000 μm, above and on four opposing sides of the semiconductor die 705, and landed on the metal layer 301. In this instance, the metal layer 801 is formed on the semiconductor die 705, however, it is contemplated that it could also be formed over, e.g., 100 μm to 1,000 μm.

The embodiments of the present disclosure can achieve several technical effects, such as higher shielding efficiency, lower package thickness and smaller opening of the protective metal layers relative to known MRAM package structures. In addition, the present method provides an MRAM packaging suitable for both wire bonding and flip-chip packages whereas there are no known flip chip solutions for MRAM packaging. Further, embedding a metal layer into a PCB substrate eliminates the process of attaching bottom metal layers, thereby simplifying the packaging process. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices including MRAMs.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming a first metal layer embedded between an upper and a lower portion of a printed circuit board (PCB) substrate, the first metal layer having a pair of metal filled vias laterally separated;
attaching a semiconductor die to the upper portion of the PCB substrate between the pair of metal filled vias;
connecting the semiconductor die electrically to the PCB substrate through the pair of metal filled vias;
removing a portion of the upper portion of the PCB substrate outside of the pair of metal filled vias down to the first metal layer; and
forming a second metal layer over and on four opposing sides of the semiconductor die, the second metal layer landed on the first metal layer.

2. The method according to claim 1, comprising forming the first and second metal layers of a nickel (Ni)-iron (Fe) alloy.

3. The method according to claim 1, comprising forming the first and second metal layers to a thickness of 50 micrometer (μm) to 1000 μm.

4. The method according to claim 1, further comprising:
forming a pair of vias laterally separated in the first metal layer;
forming a dielectric layer in the pair of vias and over top and bottom surfaces of the first metal layer;
removing portions of the dielectric layer through the pair of vias; and
filling the pair of vias with a metal prior to forming the first metal layer embedded between the upper and lower portions of the PCB substrate, the pair of metal filled vias formed.

5. The method according to claim 1, comprising connecting the semiconductor die electrically to the PCB substrate by:
bonding the semiconductor die with wire.

6. The method according to claim 1, comprising connecting the semiconductor die electrically to the PCB substrate by:
bonding the semiconductor die with under-bump metallurgy (UBM) pads.

7. The method according to claim 6, wherein the semiconductor die is electrically connected to the PCB substrate by the UBM pads, the method further comprising:
forming a metal layer between the UBM pads and the upper portion of the PCB substrate prior to connecting the semiconductor die.

8. The method according to claim 1, comprising forming the second metal layer over the semiconductor die by:
forming a 100 μm to 1,000 μm gap between the second metal layer and the semiconductor die.

9. The method according to claim 1, comprising forming the second metal layer over the semiconductor die by:
forming the second metal layer on the semiconductor die.

10. The method according to claim 1, wherein the semiconductor die comprises a magnetic random access memory (MRAM) structure.

11. A method comprising:
forming a first metal layer to a thickness of 50 micrometer (μm) to 1000 μm embedded between an upper and a lower portion of a printed circuit board (PCB) substrate, the first metal layer having a pair of metal filled vias laterally separated;
attaching an MRAM structure to the upper portion of the PCB substrate between the pair of metal filled vias;
connecting the MRAM structure electrically to the PCB substrate through the pair of metal filled vias by bonding the MRAM structure with wires or under-bump metallurgy (UBM) pads;
removing a portion of the upper portion of the PCB substrate outside of the pair of metal filled vias down to the first metal layer; and
forming a second metal layer to a thickness of 50 μm to 1000 μm over and on four opposing sides of the MRAM structure, the second metal layer landed on the first metal layer.

12. The method according to claim 11, comprising forming the first and second metal layers of a nickel (Ni)-iron (Fe) alloy.

13. The method according to claim 11, further comprising:
   forming a pair of vias laterally separated in the first metal layer;
   forming a dielectric layer in the pair of vias and over top and bottom surfaces of the first metal layer;
   removing portions of the dielectric layer through the pair of vias; and
   filling the pair of vias with a metal prior to forming the first metal layer, the pair of metal filled vias formed.

* * * * *